(12) United States Patent
Ye et al.

(10) Patent No.: US 11,604,089 B2
(45) Date of Patent: Mar. 14, 2023

(54) MASS FLOW VERIFICATION BASED ON RATE OF PRESSURE DECAY

(71) Applicant: Applied Materials, Inc., Santa Clara, CA (US)

(72) Inventors: Zhiyuan Ye, San Jose, CA (US); Justin Hough, San Jose, CA (US); Marcel E. Josephson, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 121 days.

(21) Appl. No.: 17/247,091

(22) Filed: Nov. 30, 2020

(65) Prior Publication Data
US 2021/0080313 A1    Mar. 18, 2021

Related U.S. Application Data

(62) Division of application No. 15/936,428, filed on Mar. 26, 2018, now Pat. No. 10,866,135.

(51) Int. Cl.
*G01F 25/17* (2022.01)
*G01F 1/36* (2006.01)
*G05D 7/06* (2006.01)
*G05B 23/02* (2006.01)
(Continued)

(52) U.S. Cl.
CPC .............. *G01F 25/17* (2022.01); *G01F 1/363* (2013.01); *G01F 1/38* (2013.01); *G01F 1/50* (2013.01);
(Continued)

(58) Field of Classification Search
None
See application file for complete search history.

(56) References Cited

U.S. PATENT DOCUMENTS

| 6,363,958 B1 | 4/2002 | Ollivier |
| 7,461,549 B1 * | 12/2008 | Ding ........................ G01F 7/00 73/239 |

(Continued)

FOREIGN PATENT DOCUMENTS

| JP | 2008170410 A | 7/2008 |
| JP | 2011515660 A | 5/2011 |

(Continued)

OTHER PUBLICATIONS

International Search Report and Written Opinion for Application No. PCT/US2019/018800 dated Jun. 4, 2019, 13 pages.

*Primary Examiner* — Paul M. West
*Assistant Examiner* — Mark A Shabman
(74) *Attorney, Agent, or Firm* — Lowenstein Sandler LLP

(57) ABSTRACT

An electronic device manufacturing system includes: a gas supply; a mass flow controller (MFC) coupled to the gas supply; an inlet coupled to the MFC; an outlet; a control volume serially coupled to the inlet to receive a gas flow; and a flow restrictor serially coupled to the control volume and the outlet. A controller is adapted to allow the gas supply to flow gas through the control volume and the flow restrictor to achieve a stable pressure in the control volume, terminate the gas flow from the gas supply, and measure a rate of pressure decay in the control volume over time. A process chamber is coupled to a flow path, which is coupled to the mass flow controller, the process chamber to receive one or more process chemistries via the mass flow controller.

20 Claims, 6 Drawing Sheets

(51) Int. Cl.
*G01F 1/50* (2006.01)
*G01F 1/38* (2006.01)
*G01F 25/10* (2022.01)
*G01F 1/42* (2006.01)
*H01L 21/67* (2006.01)

(52) U.S. Cl.
CPC ............. *G01F 25/15* (2022.01); *G05B 23/02* (2013.01); *G05D 7/0682* (2013.01); *G05D 7/0694* (2013.01); *G01F 1/42* (2013.01); *H01L 21/67017* (2013.01)

(56) References Cited

U.S. PATENT DOCUMENTS

| | | |
|---|---|---|
| 9,739,655 B2 | 8/2017 | Banares et al. |
| 2006/0278276 A1 | 12/2006 | Tanaka et al. |
| 2006/0283254 A1 | 12/2006 | Ding et al. |
| 2009/0023123 A1 | 1/2009 | Seo |
| 2009/0112504 A1* | 4/2009 | Ding ................ G01F 22/02 702/100 |
| 2009/0183549 A1* | 7/2009 | Monkowski ........... G01F 25/17 73/861.52 |
| 2011/0022334 A1 | 1/2011 | Ding et al. |
| 2013/0174635 A1 | 7/2013 | Yasuda et al. |
| 2014/0083514 A1 | 3/2014 | Ding |
| 2014/0190579 A1 | 7/2014 | Ding |
| 2017/0271183 A1 | 9/2017 | Brashear et al. |
| 2017/0271184 A1 | 9/2017 | Brashear et al. |
| 2017/0370763 A1 | 12/2017 | Brashear et al. |

FOREIGN PATENT DOCUMENTS

| | | |
|---|---|---|
| KR | 10-2009-0023123 A | 3/2009 |
| WO | 2018008420 A1 | 1/2018 |

\* cited by examiner

MASS FLOW VERIFICATION BASED ON RATE OF PRESSURE DECAY

RELATED APPLICATIONS

This is a divisional application of, and claims priority from, U.S. patent application Ser. No. 15/936,428, filed Mar. 26, 2018, and entitled "Methods, Systems, and Apparatus for Mass Flow Verification Based on Rate of Pressure Decay," the disclosure of which is hereby incorporated by this reference herein.

FIELD

This disclosure relates to electronic device manufacturing and, more particularly, to verifying mass flow rates of mass flow controllers based on rate of pressure decay.

BACKGROUND

Electronic device manufacturing systems may include one or more mass flow controllers (MFCs). MFCs control the mass flow rates of process chemistries used in the manufacture of electronic devices. Process chemistries may include various process gases (e.g., cleaning, deposition, and etchant gases) that are delivered to one or more process chambers in which electronic devices may be fabricated on semiconductor wafers, glass plates, or the like. Precise mass flow control of process gases may be used in one or more steps of an electronic device's fabrication process. Precise mass flow control provided by MFCs may contribute to high yield production of electronic devices having microscopically small dimensions.

To ensure that process chemistries are delivered accurately, verification and calibration of MFC's may be performed periodically. However, conventional methods of verifying and calibrating MFCs may involve significant additional bulky and expensive equipment that may be time consuming and inefficient to use, may be limited to low mass flow rate ranges (e.g., up to only 3000 sccm (standard cubic centimeter per minute) nitrogen equivalent), may result in notable process downtime, and/or may not be sufficiently accurate to ensure precise mass flow control of process chemistries.

SUMMARY

In some embodiments, an electronic device manufacturing system is provided. The electronic device manufacturing system includes a gas supply; a mass flow controller (MFC) coupled to the gas supply; an inlet coupled to the MFC; an outlet; a control volume serially coupled to the inlet to receive a gas flow; and a flow restrictor serially coupled to the control volume and the outlet. The system further includes a controller adapted to allow the gas supply to flow gas through the control volume and the flow restrictor to achieve a stable pressure in the control volume, terminate the gas flow from the gas supply, and measure a rate of pressure decay in the control volume over time. The system further includes a process chamber coupled to a flow path, which is coupled to the mass flow controller, the process chamber to receive one or more process chemistries via the mass flow controller In some other embodiments, a method is disclosed of verifying a mass flow controller. The method of verifying a mass flow controller includes causing a gas to flow from a gas supply through a calibrated flow standard, a control volume, and a flow restrictor at a steady pressure measured in the control volume; terminating the gas flow from the gas supply; measuring a first rate of gas pressure decay in the control volume; replacing the calibrated flow standard with the mass flow controller; causing the gas to flow from the gas supply through the mass flow controller, the control volume, and the flow restrictor at a stable pressure measured in the control volume; terminating the gas flow from the gas supply; and measuring a second rate of gas pressure decay in the control volume for purposes of verifying the mass flow controller.

In yet other embodiments, a system is provided. The system includes an inlet coupled to a mass flow controller, which is coupled to a gas supply; an outlet; a control volume serially coupled to the inlet to receive a gas flow; a flow restrictor serially coupled to the control volume and the outlet; and a controller adapted to allow the gas supply to flow gas through the control volume and the flow restrictor to achieve a stable pressure in the control volume, terminate the gas flow from the gas supply, and measure a rate of pressure decay in the control volume over time to verify the mass flow controller.

Still other aspects, features, and advantages in accordance with these and other embodiments of the disclosure may be readily apparent from the following detailed description, the appended claims, and the accompanying drawings. Accordingly, the drawings and descriptions herein are to be regarded as illustrative in nature, and not as restrictive.

BRIEF DESCRIPTION OF DRAWINGS

The drawings, described below, are for illustrative purposes only and are not necessarily drawn to scale. The drawings are not intended to limit the scope of the disclosure in any way.

DETAILED DESCRIPTION

Figure 1:
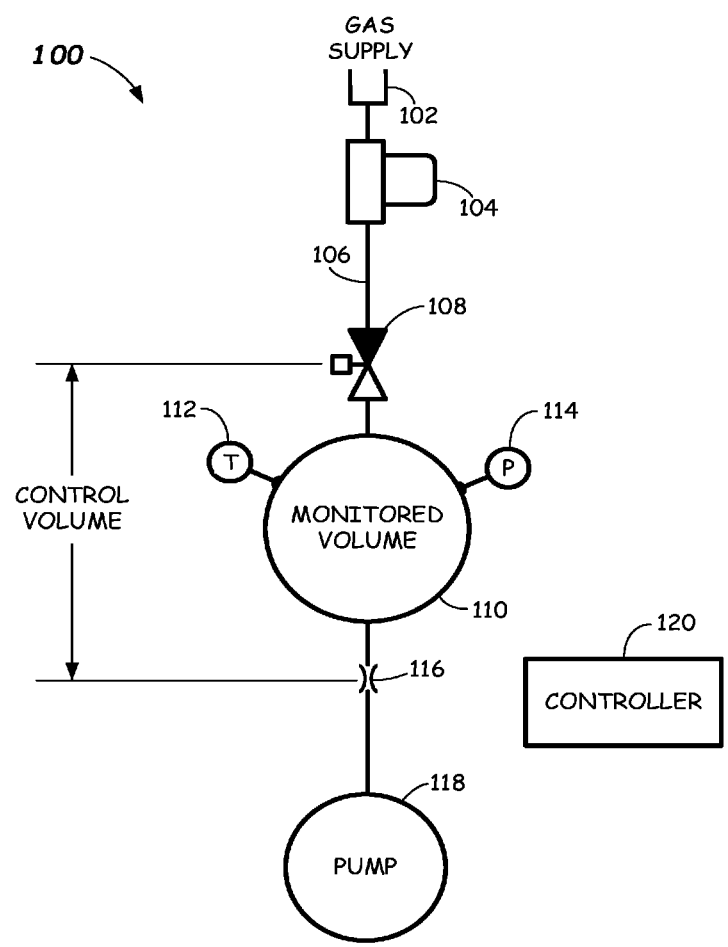
FIG. 1 illustrates a first mass flow control verification system according to embodiments of the disclosure.

Reference will now be made in detail to example embodiments of the disclosure, which are illustrated in the accompanying drawings. Wherever possible, the same reference numbers will be used throughout the drawings to refer to the same or like parts.

Electronic devices having microscopically small dimensions may be produced with process gas chemistries having mass flow rate accuracies as high as +/−1%. Many mass flow controllers (MFCs) may be specified as such and may meet those specifications when new, while a small percentage of MFCs may be specified as such, but may not actually meet them when new or otherwise. Furthermore, even initially accurate MFCs may over time experience an accuracy drift in their mass flow rates that may render them outside of their specified accuracies. Accordingly, verification and calibration of MFCs, such as those used in semiconductor fabrication equipment, may be performed periodically to ensure that process gas chemistries are delivered accurately.

Existing methods and the associated hardware for mass flow verification typically operate based on measuring pressure rate of rise (ROR) in a known volume. ROR principles are based on the ideal gas law being used to correlate a mass flow rate with a measured pressure rate of rise in a known enclosed volume. The higher the mass flow rate, the larger the enclosed volume should be to ensure accuracy. ROR principles may involve a lengthy process (e.g., 10 or more hours in some cases) of filling an enclosed volume with a gas and measuring ROR within the enclosed volume. The enclosed volume may be a process chamber of a manufacturing system or an external volume. Uncertainties in the exact volume of a process chamber or external volume may adversely affect the accuracy of the results. A process using ROR principles may involve measurements of pressure, temperature, volume, and time. One significant problem with conventional ROR-based methods is that the known volume typically includes a reservoir and the flow path leading to the reservoir from the MFC unit under test (UUT). The rate of pressure change is measured inside the reservoir at almost stagnation and the dynamic pressure inside the flow path leading to the reservoir is not measured. Lack of the measurement of rate of pressure change in one of the two portions of the known volume can result in erroneous calculations leading to mischaracterization of the flow out of the UUT. In contrast with such conventional methods, embodiments disclosed herein eliminate the error introduced by the volume of the flow path. The present methods and apparatus operate based on measuring the rate of pressure decay in a known volume and thus, does not include an unmeasured flow path.

More specifically, mass flow verification methods, systems, and apparatus in accordance with one or more embodiments of the disclosure are based on pressure decay principles for determining a gas mass flow rate, which may be in units of "sccm" (standard cubic centimeters per minute) or "slm" (standard liters per minute). Mass flow verification methods, systems, and apparatus based on pressure decay principles in accordance with one or more embodiments of the disclosure may reduce the number of variables needed to calculate mass flow rate, may result in a smaller verification equipment footprint, and may be more time efficient and more accurate than mass flow verification methods, systems, and apparatus based on conventional ROR-based principles. In contrast to ROR-based methods, non-ROR pressure decay measurement may be almost instantaneous, and calculating a mass flow rate based on rate of pressure decay (ROPD) principles may involve just two measurements—pressure and temperature.

The ideal gas law, also called the general gas equation, is the equation of state of a hypothetical ideal gas. It is an approximation of the behavior of many gases under many conditions. The ideal gas law is often expressed as:

$$(PV=nRT)$$

where P is the pressure of the gas, V is the volume of the gas, n is the amount of substance of gas (in moles), R is the ideal, or universal gas constant, equal to the product of the Boltzmann constant and the Avogadro constant, and T is the absolute temperature of the gas.

FIG. 1 depicts an example arrangement for verifying a MFC. The mass flow verification system 100 of FIG. 1 includes a gas supply 102 that provides a pressurized flow of a suitable gas (e.g., nitrogen, oxygen, clean dry air (CDA), etc.) to a location 104. The flow rate of the gas is unlimitedly scalable by specifying appropriate monitored volume 110 and flow restrictor 116 sizes. At location 104, either a reference (e.g., a calibrated flow standard) or a UUT can be positioned to receive the gas. The output of the reference or UUT at location 104 can be coupled to a line 106 leading to a valve 108 (e.g., an isolation valve) that is coupled to a monitored volume 110. The monitored volume 110 is monitored using a connected thermocouple 112 and a connected manometer 114 or other suitable pressure measuring device. The output of the monitored volume 110 is coupled to a flow restrictor 116 which is coupled to a vacuum pump 118. In some embodiments, the flow restrictor 116 can be a drilled orifice flow restrictor, or a porous media flow restrictor when pressure and temperature downstream of the flow restrictor 116 are measured. The mass flow verification system 100 is operated under the control of controller 120 which can be coupled to each operable component and each sensor component (n.b., connections are not shown for illustrative clarity).

Using the arrangement shown in FIG. 1, the Control Volume (V) (i.e., the labeled volume between valve 108 and flow restrictor 116 including monitored volume 110) is first determined by using a calibrated flow standard in location 104. The calibrated flow standard at location 104 is given a set point and adequate time is allowed for pressure and temperature in the monitored volume 110 to stabilize to a steady state. At time $t_o$, where the pressure is measured and labeled $P_o$, valve 108 is commanded to be closed by controller 120. After time $t_o$, the pressure inside the Control Volume begins to decay as the gas continues to flow through the flow restrictor 116. The Control Volume is calculated based on:

$$V=RT(dn/dt)/(dP/dt)$$

Evaluating dP/dt at $t_o$ where the pressure is $P_o$ and using the set point of the calibrated flow standard at location 104 as dn/dt at $t_o$ in the above equation provides the value for the Control Volume. Once the volume of the Control Volume is determined, the calibrated flow standard at location 104 is replaced with a UUT MFC. The UUT MFC is given a set point that is to be verified. Solving the above equation for dn/dt, the accuracy of the UUT MFC can be determined by comparing the given set point to the calculated mass flow rate using the equation:

$$dn/dt=(V/RT)(dP/dt)$$

The above described method assumes that valve 108 closes instantaneously. In reality, the actual time it takes for the complete closure of valve 108 due to latencies in communication from the controller 120 and hardware actuator response is some small but significant amount Δt beyond $t_o$. During Δt, the calibrated gas flow is still flowing into the Control Volume while pressure inside the Control Volume is decaying at a rate slower than indicated by the above calculations as a result of the latencies. Once valve 108 is completely closed, the calibrated gas flow no longer flows into the Control Volume and the pressure inside the Control Volume continues to decay, but at a faster rate. Embodiments of the present disclosure provide methods and apparatus to compensate for the time Δt it takes for value 108 to close completely. Specifically, embodiments of the disclosure provide methods for evaluating dP/dt at $t_o$ even though the mass flow rate is steady only after Δt has elapsed.

Figure 4:
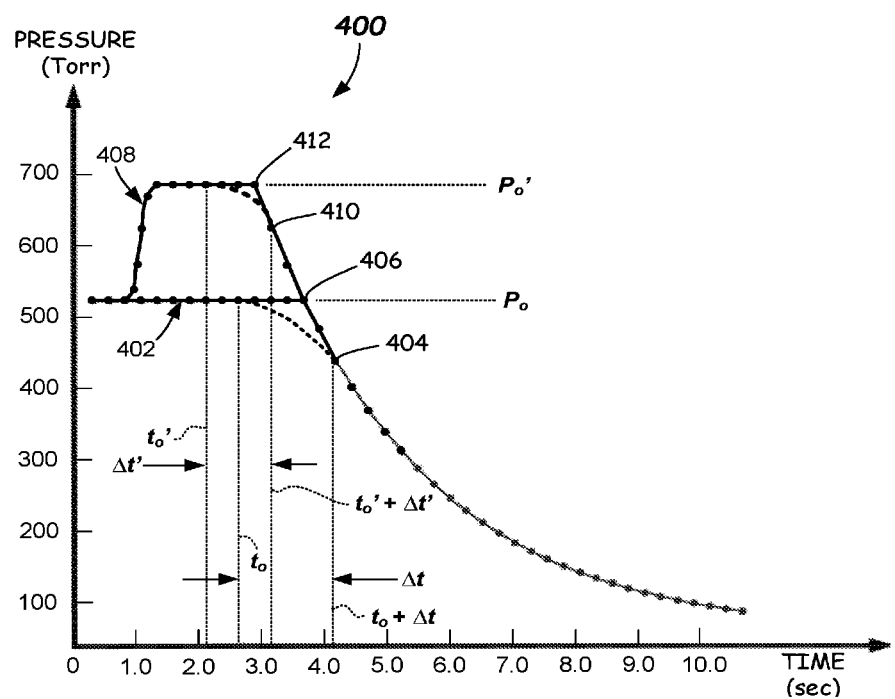
FIG. 4 illustrates a graph of several pressures measured during mass flow verification according to embodiments of the disclosure.

In the first example method of evaluating dP/dt at $t_o$, using the mass flow verification system 100 shown in FIG. 1 with a calibrated flow standard installed at location 104 at a known set point, valve 108 is opened to establish flow through the control volume and pressure is measured in the monitored volume 110 via the manometer 114. Note that the valve 108 is normally closed until actuated. Enough time to establish a steady state, stabilized flow is allowed to pass until a baseline measurement of $P_o$ can be made. Referring to graph 400 of FIG. 4 and specifically the changing pressure over time dP/dt plot 402, $P_o$ is stabilized during the time before $t_o$. At $t_o$ valve 108 is closed. Next, the time $t_o+\Delta t$ is determined by locating the decaying pressure inflection point 404 on the dP/dt plot 402. Next, the measured data points beyond time $t_o+\Delta t$ are used to determine an equation for the decaying pressure. Any number of curve fitting algorithms or methods can be used to determine the equation of the curve. Next, based on the determined equation, the corrected value of dP/dt at $P_o$ (i.e., point 406) is extrapolated back from the measured data points. The corrected value of dP/dt at $P_o$ for the calibrated flow standard is then used to calculate V based on:

$$V=RT(dn/dt)/(dP/dt)$$

as described above. Next, a MFC UUT is installed at location 104 set at a test set point. Valve 108 is then opened to once again establish flow through the control volume and pressure is measured in the monitored volume 110 via the manometer 114. Enough time to establish a steady state, stabilized flow is allowed to pass until a baseline measurement of $P_o$ for the UUT can be made. Once $P_o$ is stabilized during the time before $t_o$, valve 108 is closed establishing time $t_o$ for the UUT. Next, the time $t_o+\Delta t$ tis determined by locating the decaying pressure inflection point 404 on an equivalent of the dP/dt plot 402. Next, the measured data points beyond time $t_o+\Delta t$ are used to determine an equation for the decaying pressure. Any number of curve fitting algorithms or methods can be used to determine the equation of the curve. Next, based on the determined equation, the corrected value of dP/dt at $P_o$ for the UUT (i.e., point 406) is extrapolated from the measured data points. The equation for actual mass flow is:

$$dn/dt=(V/RT)/(dP/dt)$$

Finally, using the above equation, the corrected value of dP/dt at $P_o$ for the UUT is used to compute the actual mass flow (dn/dt) which is compared to the test set point to determine any error. In some embodiments, based on the error, the UUT MFC can be calibrated to correct the error.

Figure 2:
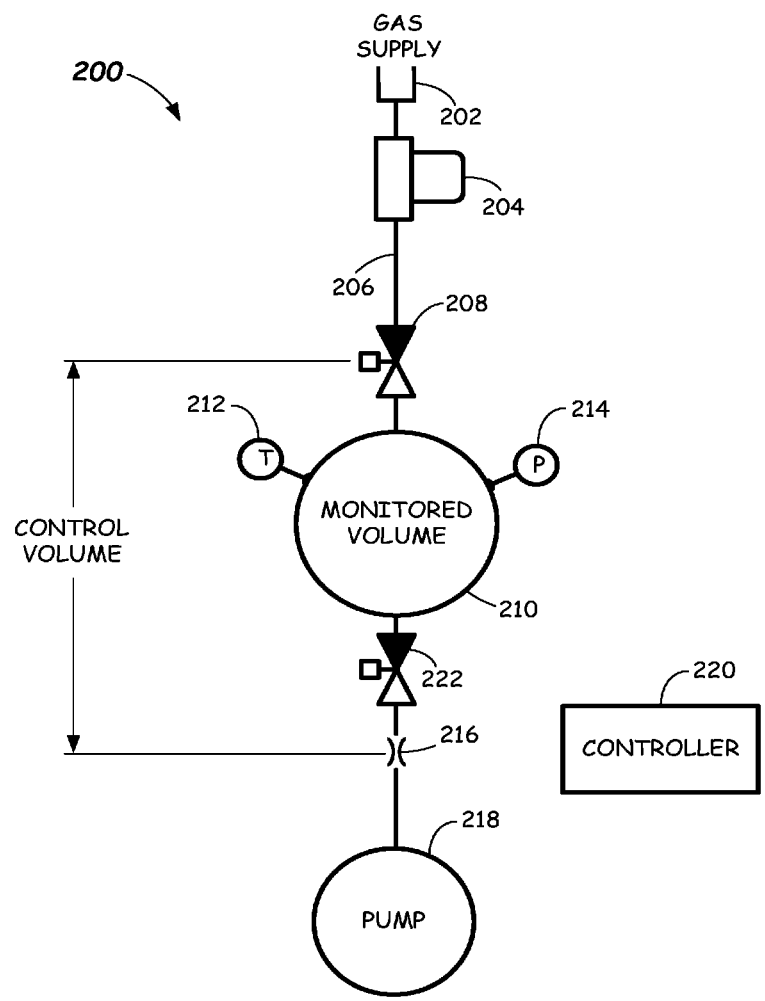
FIG. 2 illustrates a second mass flow control verification system according to embodiments of the disclosure.

An alternative second example method for MFC verification can be used to further enhance the accuracy of the verification. The second method uses the MFC verification system 200 depicted in FIG. 2. The mass flow verification system 200 includes a gas supply 202 that provides a pressurized flow of a suitable gas (e.g., nitrogen, oxygen, clean dry air (CDA), etc.) to a location 204. The flow rate of the gas is unlimitedly scalable by specifying appropriate monitored 210 volume and flow restrictor 216 sizes. At location 204, either a reference (e.g., a calibrated flow standard) or a UUT can be positioned to receive the gas. The output of the reference or UUT at location 204 can be coupled to a line 206 leading to a valve 208 (e.g., an isolation valve) that is coupled to a monitored volume 210. The monitored volume 210 is monitored using a connected thermocouple 212 and a connected manometer 214. The output of the monitored volume 210 is coupled to a second valve 222 which is coupled to a flow restrictor 216. In some embodiments, the flow restrictor 216 can be a drilled orifice restrictor, or a porous media flow restrictor when pressure and temperature downstream of the flow restrictor 216 are measured. The output of the flow restrictor 216 is coupled to a vacuum pump 218. The mass flow verification system 200 is operated under the control of controller 220 which can be coupled to each operable component and each sensor component (n.b., connections are not shown for illustrative clarity).

Note that the MFC verification system 200 is structurally identical to the MFC verification system 100 of FIG. 1 except that a second valve 222 operated by controller 220 is disposed in the line between the monitored volume 210 and the flow restrictor 216. Use of the second valve 222 allows the initial pressure in the Control Volume to be boosted up above the initial stabilized pressure as compared to the initial pressure used in the first example method. By boosting the initial pressure before the decay period begins, it is possible to take more pressure measurements over a prolonged decay period and thereby have more data points to fit a consequently more accurate curve from which to determine a more accurate characteristic equation. The boosted initial pressure is represented as $P_o'$ on the changing pressure over time dP/dt plot 408 in graph 400 of FIG. 4.

The alternative second example method for MFC verification includes the following. Initially, both valve 208 and valve 222 are opened long enough to establish steady state stable flow and measure pressure. Then valve 222 is closed for a period of time sufficient to create a pressure rise in the Control Volume up to $P_o'$. Once $P_o'$ is reached, valve 222 is opened simultaneously with valve 208 being closed. Next, the time $t_o'+\Delta t$ is determined by locating the decaying pressure inflection point 410 on the dP/dt plot 408. Next, the measured data points beyond time $t_o'+\Delta t$ are used to determine an equation for the decaying pressure. Any number of different curve fitting algorithms or methods can be used to determine the equation of the curve. Next, based on the determined equation, the corrected value of dP/dt at $P_o'$ (i.e., point 412) is extrapolated from the measured data points. The corrected value of dP/dt at $P_o'$ for the calibrated flow standard is then used to calculate V based on:

$$V=RT(dn/dt)//(dP/dt)$$

as described above. Next, a MFC UUT is installed at location 204 in place of the reference, set at a test set point, and the above described method is repeated to determine dP/dt at $P_o'$. The equation for actual mass flow is:

$$d/dt=(V/RT)/(dP/dt)$$

Finally, using the above equation, the corrected value of dP/dt at $P_o'$ for the UUT is used to compute the actual mass flow (dn/dt) which is compared to the test set point to determine any error. In some embodiments, based on the error, the UUT MFC can be calibrated to correct the error.

Figure 3:
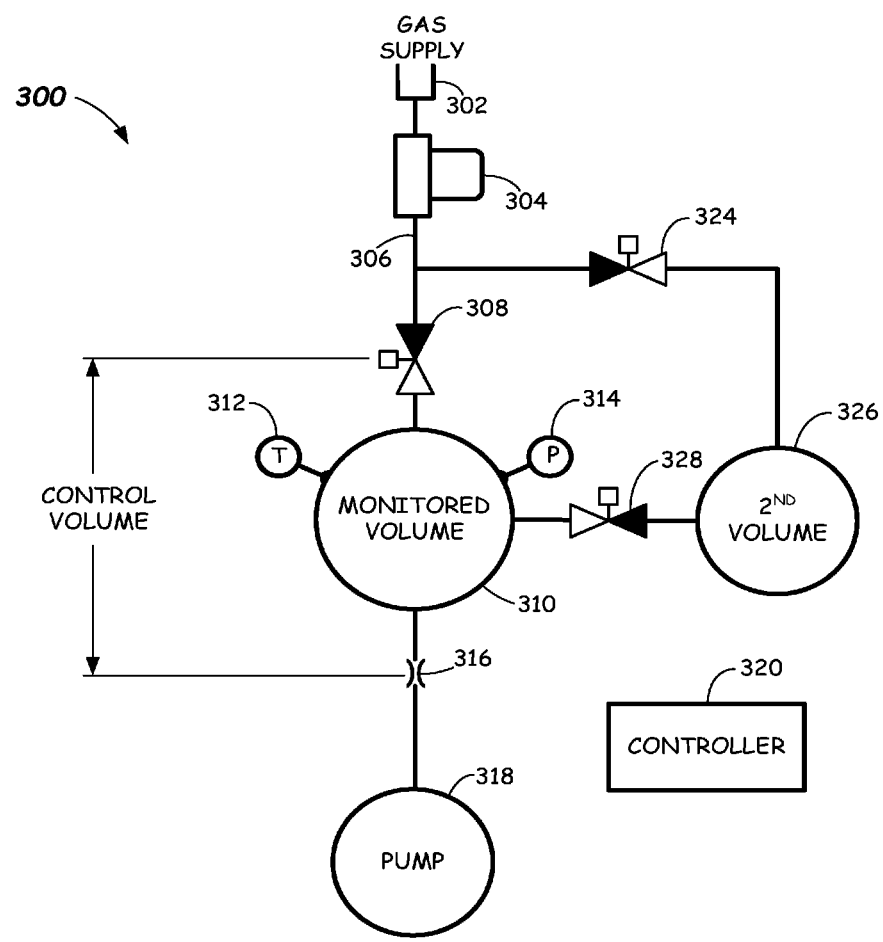
FIG. 3 illustrates a third mass flow control verification system according to embodiments of the disclosure.

An alternative third example method for MFC verification can be used to further enhance the accuracy of the verification. The third method uses the MFC verification system 300 depicted in FIG. 3. The mass flow verification system 300 includes a gas supply 302 that provides a pressurized flow of a suitable gas (e.g., nitrogen, oxygen, clean dry air (CDA), etc.) to a location 304. The flow rate of the gas is unlimitedly scalable by specifying appropriate monitored volume 310 and flow restrictor 316 sizes. At location 304, either a reference (e.g., a calibrated flow standard) or a UUT can be positioned to receive the gas. The output of the reference or UUT at location 304 can be coupled to a line 306 leading to a valve 308 (e.g., an isolation valve) that is coupled to a monitored volume 310. The monitored volume 310 is monitored using a connected thermocouple 312 and a connected manometer 314 or other suitable pressure sensor. The output of the monitored volume 310 is coupled to a flow restrictor 316. In some embodiments, the flow restrictor 316 can be a drilled orifice restrictor or a porous media flow restrictor when pressure and temperature downstream of the flow restrictor 316 are measured. The output of the flow restrictor 316 is coupled to a vacuum pump 318. The mass flow verification system 300 is operated under the control of controller 320 which can be coupled to each operable component and each sensor component (n.b., connections are not shown for illustrative clarity). Also connected to line 306 (in parallel with valve 308) is a second valve 324 which is coupled to a second volume 326. Second volume 326 includes an output coupled to a third valve 328 which has its output coupled to the monitored volume 310.

Use of the second valve 324, the second volume 326, and the third valve 328 allows the initial pressure in the Control Volume to be boosted up above the initial stabilized pressure as compared to the initial pressure used in the first example method. A store of pressurized gas is contained in the second volume 326 and injected into the monitored volume 310 to boost the initial pressure in the monitored volume 310 before the decay period begins. As with the second example method, this allows more pressure measurements to be made during a prolonged decay period (e.g., relative to the first example method) and thereby have more data points to fit a consequently more accurate curve from which to determine a more accurate characteristic equation. As with the second example method, the boosted initial pressure is represented as $P_o'$ on the changing pressure over time dP/dt plot 408 in graph 400 of FIG. 4.

The alternative third example method for MFC verification includes the following. Initially, second valve 324 is opened to establish flow and pressurize second volume 326. Second volume 326 can be pressurized up to the pressure level of the gas supply 302. In some embodiments, additional equipment (e.g., a pump) can be used to pressurize the second volume 326 to higher levels. Then the second valve 324 is closed and the first valve 308 is opened long enough to establish steady state stable flow and to measure pressure in the monitored volume 310. Once the baseline $P_o$ stabilized pressure is reached, the first valve 308 is closed simultaneously with the third valve 328 being opened. The third valve 328 is left open for a period of time sufficient to create a pressure rise in the Control Volume up to $P_o'$. Once $P_o'$ is reached, third valve 328 is closed. Next, the time $t_o'+\Delta t$ is determined by locating the decaying pressure inflection point 410 on the dP/dt plot 408. Next, the measured data points beyond time $t_o+\Delta$ are used to determine an equation for the decaying pressure. Any number of different curve fitting algorithms or methods can be used to determine the equation of the curve. Next, based on the determined equation, the corrected value of dP/dt at $P_o'$ (i.e., point 412) is extrapolated back from the measured data points. The corrected value of dP/dt at $P_o'$ for the calibrated flow standard is then used to calculate V based on:

$$V=RT(dn/dt)/(dP/dt)$$

as described above. Next, a MFC UUT is installed at location 204 in place of the reference, set at a test set point, and the above described method is repeated to determine dP/dt at $P_o'$. The equation for actual mass flow is:

$$dn/dt=(V/RT)(dP/dt)$$

Finally, using the above equation, the corrected value of dP/dt at $P_o'$ for the UUT is used to compute the actual mass flow (dn/dt) which is compared to the test set point to determine any error. In some embodiments, based on the error, the UUT MFC can be calibrated to correct the error.

Flow restrictors with particularly small diameter drilled orifices are challenging to manufacture with tight reproducibility specifications. The present example methods and apparatus removes the variability of the flow restrictor out of the equation. In some embodiments, the present example methods and apparatus can be used to determine the discharge coefficient of drilled orifices and to characterize porous media flow restrictors by calculating the ratio of actual mass flow rate over theoretically computed mass flow rate.

The use of the ideal gas equation as described above for reduced-pressure (i.e., vacuum-based) applications provides sufficient accuracy for verification of reduced-pressure MFCs. In embodiments adapted for atmospheric applications (e.g., without vacuum pumps) a non-ideal gas equation (such as the van der Waals equation below) can be applied to the present methods and apparatus for mass flow verification. The van der Waals equation is given as:

$$\left(P+\frac{an^2}{V^2}\right)(V-nb)=nRT$$

and can be used in place of the ideal gas law for atmospheric applications by applying gas specific corrections for intermolecular forces (parameter a) and for finite molecular size (parameter b) to the equation above. For wider range mass flow verification requirements, multiple volume sizes can be used. In these cases, a single optimized volume with appropriate partitions can be used. Partitions divide up the volume into smaller segments and by selective removal of partitions, multiple combinations of larger volumes may be created.

Figure 5:
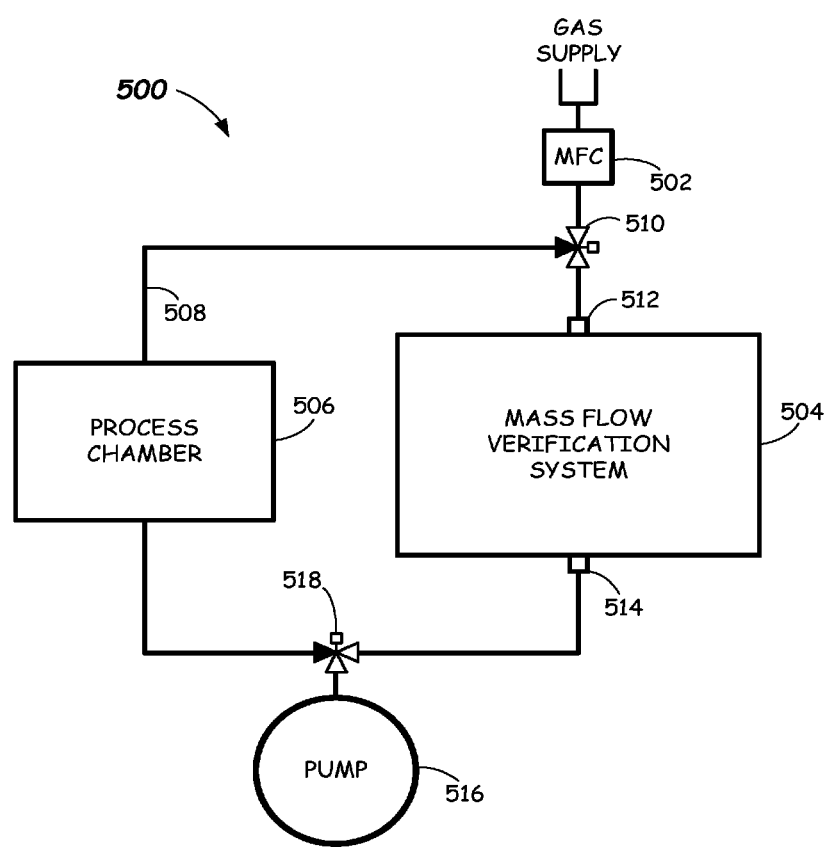
FIG. 5 illustrates an electronic device manufacturing system according to embodiments of the disclosure.

FIG. 5 illustrates an electronic device manufacturing system 500 in accordance with one or more embodiments. Electronic device manufacturing system 500 may include an MFC 502, a mass flow verification system 504, and a process chamber 506. In some embodiments, MFC 502 may represent a plurality of MFCs coupled via a common manifold or header to a common outlet, wherein MFC 502 as described below may represent the one MFC of the plurality of MFCs to be verified (i.e., the only MFC of the plurality of MFCs flowing gas during verification).

Process chamber 506 may be coupled to a flow path 508 coupled to mass flow controller 502 via an isolation valve 510. Process chamber 506 may be configured to receive one or more process chemistries via MFC 502 and to have a reduced-pressure chemical vapor deposition process, or a reduced-pressure epitaxy process, or one or more deposition, oxidation, nitration, etching, polishing, cleaning, and/or lithography processes performed therein.

Mass flow verification system 504 may have an inlet 512 and an outlet 514. Inlet 512 may be coupled to MFC 502 via isolation valve 510. Mass flow verification system 504 may be any one of mass flow verification systems 100, 200, or 300 described above.

In those embodiments where electronic device manufacturing system 500 operates under a reduced-pressure application, mass flow verification system 504 may be any one of mass flow verification systems 100, 200, or 300. Mass flow verification system 504 may be coupled via outlet 514 to a system vacuum pump 516 of electronic device manufacturing system 500 via an isolation valve 518. System vacuum pump 516 may also be coupled to process chamber 506 via isolation valve 518.

In those embodiments where electronic device manufacturing system 500 operates under an atmospheric application, mass flow verification system 504 may be mass flow verification system 100, 200, or 300 and the system vacuum pump 516 may be excluded from electronic device manufacturing system 500.

The operation of electronic device manufacturing system 500 and/or mass flow verification system 504 may be controlled by a controller such as, e.g., one of controllers 120, 220, or 320.

Figure 6:
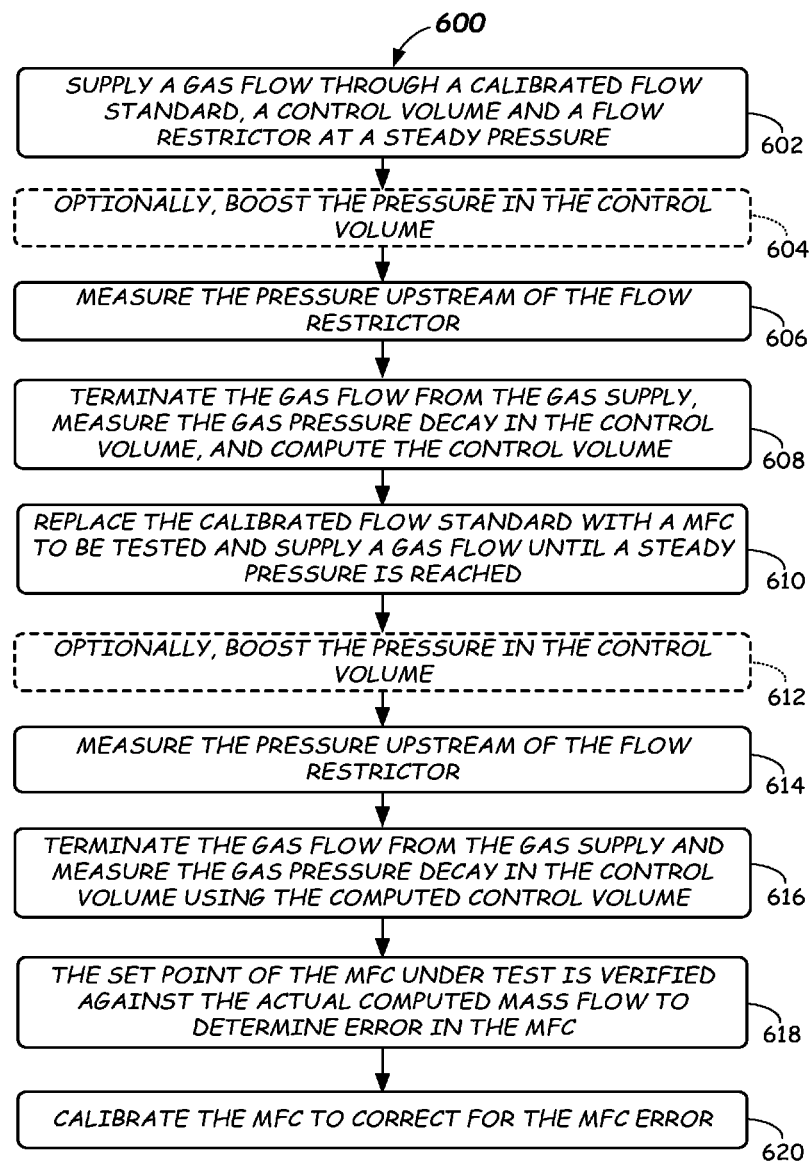
FIG. 6 illustrates a flowchart of a method of mass flow control verification according to embodiments of the disclosure.

FIG. 6 illustrates a flowchart of a method 600 of verifying a MFC flow rate in accordance with one or more embodiments. Initially, a gas is supplied to a calibrated flow standard and flowed through a serially connected control volume and a flow restrictor (602). The gas is flowed until a steady state stabilized pressure is achieved in the control volume. Optionally, the pressure in the control volume can be boosted (604) to provide more range over which the decaying pressure can be measured. Next, the pressure is measured upstream of the flow restrictor in the control volume (606). The flow from the gas supply is terminated and the gas pressure decay in the control volume is measured over time (608), and this data, along with the set point of the calibrated flow standard, is used to compute the actual volume of the control volume (608). The calibrated control standard is replaced with a MFC to be tested (UUT) and gas is flowed until a steady state stabilized pressure is achieved in the control volume (610). Optionally, the pressure in the control volume can be boosted (612) to provide more range over which the decaying pressure can be measured. The pressure in the control volume is measured (614), the flow from the gas supply is terminated, and the gas pressure decay in the control volume is measured over time based on the computed actual control volume (616). The set point of the MFC under test is verified by comparing the set point of the MFC under test to the actual computed mass flow determined by measuring the pressure decay with the tested MFC installed, where any difference is the error in the MFC (618). The MFC is calibrated to correct for the error determined in the MFC (620).

The above process blocks of method 600 may be executed or performed in an order or sequence not limited to the order and sequence shown and described. For example, in some embodiments, one process block may be performed simultaneously with or after another process block. In some embodiments, a non-transitory computer-readable storage medium, such as, e.g., a removable storage disk, memory or device, may include computer readable instructions stored thereon that are capable of being executed by processor, such as, e.g., controllers 120, 220, 320, to perform process blocks 602-620 of method 600.

The foregoing description discloses only example embodiments of the disclosure. Modifications of the above-disclosed assemblies, apparatus, systems, and methods may fall within the scope of the disclosure. Accordingly, while example embodiments of the disclosure have been disclosed, it should be understood that other embodiments may fall within the scope of the disclosure, as defined by the following claims.

What is claimed is:

1. An electronic device manufacturing system, comprising:
  a gas supply;
  a mass flow controller (MFC) coupled to the gas supply;
  an inlet coupled to the MFC;
  an outlet;
  a control volume serially coupled to the inlet to receive a gas flow;
  a flow restrictor serially and directly coupled to the control volume and to the outlet;
  a controller adapted to allow the gas supply to flow gas through the control volume and the flow restrictor to achieve a stable pressure in the control volume, terminate the gas flow from the gas supply, and measure a rate of pressure decay in the control volume over time; and
  a process chamber coupled to a flow path, wherein the flow path includes the control volume and is coupled to the mass flow controller, the process chamber to receive one or more process chemistries via the mass flow controller.

2. The electronic device manufacturing system of claim 1, further comprising a valve coupled between the inlet and the control volume, wherein the valve is operable by the controller to terminate the gas flow from the gas supply.

3. The electronic device manufacturing system of claim 1, wherein the controller is to determine an error in the MFC by comparing a set point of the MFC to an actual mass flow calculated based on a volume of the control volume, wherein the volume is determined based on the rate of pressure decay in the control volume over time measured with a calibrated gas flow standard.

4. The electronic device manufacturing system of claim 1, wherein the flow restrictor is at least one of a drilled orifice flow restrictor or a porous media flow restrictor.

5. The electronic device manufacturing system of claim 1, further comprising a valve coupled between the control volume and the flow restrictor, the valve operable by the controller to cause pressure to build in the control volume.

6. The electronic device manufacturing system of claim 1, further comprising a second volume couplable to the control volume and operable by the controller to boost pressure in the control volume by supplying a pressurized gas to the control volume.

7. The electronic device manufacturing system of claim 6, further comprising:
  a first valve for coupling the second volume to the inlet; and
  a second valve for coupling the second volume to the control volume.

8. The electronic device manufacturing system of claim 1, wherein the process chamber is to perform one or more of a reduced-pressure chemical vapor deposition process, a reduced-pressure epitaxy process, or at least one of deposition, oxidation, nitration, etching, polishing, cleaning, or a lithography process performed within the process chamber.

9. A method of verifying a mass flow controller, the method comprising:
  causing a gas to flow from a gas supply through a calibrated flow standard, a control volume, and a flow restrictor at a stable pressure measured in the control volume, wherein the flow restrictor is serially and directly coupled to the control volume and to an outlet;
  terminating the gas flow from the gas supply;
  measuring a first rate of gas pressure decay in the control volume;
  replacing the calibrated flow standard with the mass flow controller;
  causing the gas to flow from the gas supply through the mass flow controller, the control volume, and the flow restrictor at a stable pressure measured in the control volume;
  terminating the gas flow from the gas supply; and measuring a second rate of gas pressure decay in the control volume for purposes of verifying the mass flow controller.

10. The method of claim 9, further comprising determining an error of the mass flow controller by:
   computing a volume of the control volume based on the first rate of gas pressure decay;
   using the computed volume to determine an actual mass flow based on the second rate of gas pressure decay; and
   comparing the actual mass flow to a set point of the mass flow controller.

11. The method of claim 10, further comprising calibrating the mass flow controller based on the determined error of the mass flow controller.

12. The method of claim 9, further comprising increasing the stable pressure in the control volume before measuring the first and second rates of gas pressure decay.

13. A non-transitory computer-readable storage medium on which computer readable instructions are stored, wherein the computer readable instructions, when executed by a processor, cause the processor to perform the method of claim 9.

14. A system comprising:
   an inlet coupled to a mass flow controller, which is coupled to a gas supply;
   an outlet;
   a control volume serially coupled to the inlet to receive a gas flow from the gas supply;
   a flow restrictor serially and directly coupled to the control volume and to the outlet; and
   a controller adapted to allow the gas supply to flow gas through the control volume and the flow restrictor to achieve a stable pressure in the control volume, terminate the gas flow from the gas supply, and measure a rate of pressure decay in the control volume over time to verify the mass flow controller.

15. The system of claim 14, further comprising a valve coupled between the inlet and the control volume, wherein the valve is operable by the controller to terminate the gas flow from the gas supply.

16. The system of claim 14, wherein the controller is further to determine an error in the mass flow controller by comparing a set point of the mass flow controller to an actual mass flow calculated based on a volume of the control volume, wherein the volume is determined based on the rate of pressure decay in the control volume over time measured with a calibrated gas flow standard.

17. The system of claim 14, wherein the flow restrictor is at least one of a drilled orifice flow restrictor or a porous media flow restrictor.

18. The system of claim 14, further comprising a valve coupled between the control volume and the flow restrictor, the valve operable by the controller to cause pressure to build in the control volume.

19. The system of claim 14, further comprising a second volume couplable to the control volume and operable by the controller to boost pressure in the control volume by supplying a pressurized gas to the control volume.

20. The system of claim 19, further comprising:
   a first valve for coupling the second volume to the inlet; and
   a second valve for coupling the second volume to the control volume.

\* \* \* \* \*